United States Patent
Kushner et al.

(10) Patent No.: US 7,003,068 B2
(45) Date of Patent: Feb. 21, 2006

(54) DEVICE FOR SUBTRACTING OR ADDING A CONSTANT AMOUNT OF CHARGE IN A CHARGE-COUPLED DEVICE AT HIGH OPERATING FREQUENCIES

(75) Inventors: Lawrence J. Kushner, Andover, MA (US); Michael P. Anthony, Andover, MA (US); Edward Kohler, Waltham, MA (US)

(73) Assignee: Kenet, Inc., Reading, MA (US)

( * ) Notice: Subject to any disclaimer, the term of this patent is extended or adjusted under 35 U.S.C. 154(b) by 59 days.

(21) Appl. No.: 10/872,820

(22) Filed: Jun. 21, 2004

(65) Prior Publication Data

US 2005/0281369 A1 Dec. 22, 2005

(51) Int. Cl.
*G11C 19/28* (2006.01)
*H03K 23/46* (2006.01)
(52) U.S. Cl. .............................. 377/57; 377/62; 377/63
(58) Field of Classification Search ...................... None
See application file for complete search history.

(56) References Cited

U.S. PATENT DOCUMENTS

| | | | | |
|---|---|---|---|---|
| 3,999,082 A | * | 12/1976 | Early | 377/58 |
| 5,091,922 A | * | 2/1992 | Uehira | 377/58 |
| 5,760,430 A | * | 6/1998 | Kato | 257/236 |

* cited by examiner

*Primary Examiner*—Tuan T. Lam
(74) *Attorney, Agent, or Firm*—Hamilton, Brook, Smith & Reynolds, P.C.

(57) ABSTRACT

A circuit for adding or subtracting an amount of charge from a charge sample, such as in a Charge Coupled Device (CCD), by portioning and pipelining the processing stages, to avoid introducing a memory effect. The operation, such as subtraction, is split into multiple stages, with each stage responsible for removing only a portion of the total amount of charge that is desired to be removed. The subtraction pipeline stages operate together to remove the total desired charge amount. In one embodiment each successive subtraction stage removes a corresponding lesser amount of charge. As a result, greater accuracy in the amount of charge removed is achieved as well operation at higher frequencies than previous charge subtraction approaches.

13 Claims, 6 Drawing Sheets

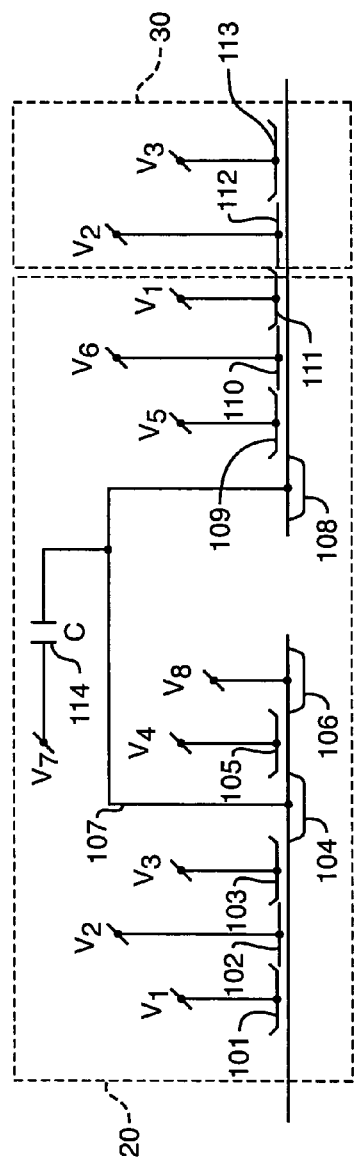
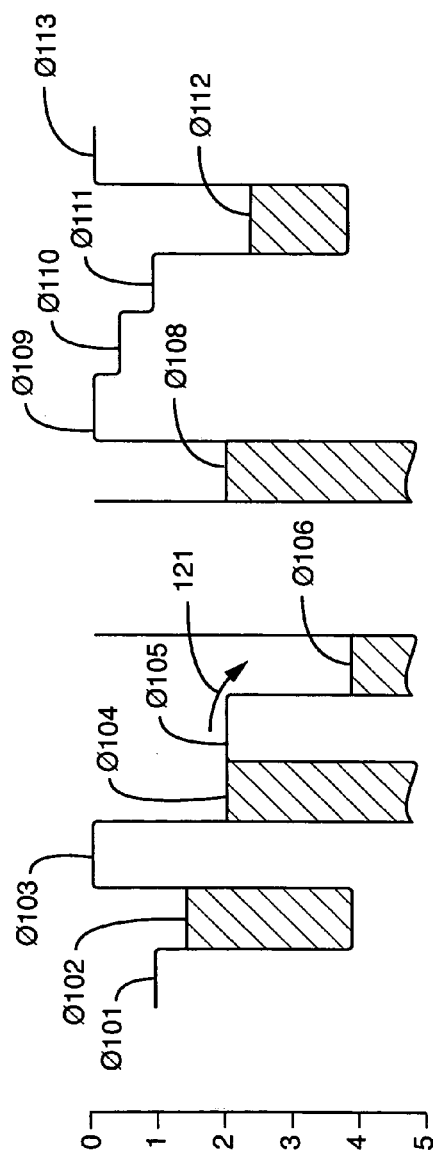
FIG. 2
FIG. 3A

DEVICE FOR SUBTRACTING OR ADDING A CONSTANT AMOUNT OF CHARGE IN A CHARGE-COUPLED DEVICE AT HIGH OPERATING FREQUENCIES

BACKGROUND OF THE INVENTION

This invention relates to a circuit for subtracting a constant amount of charge from a given charge sample such as may be used in a Charge Coupled Device (CCD).

Charge Coupled Devices (CCDs) now find widespread use in consumer devices, including digital cameras, cellular telephones, wireless data network equipment, audio devices such as MP3 players, and video equipment such as Digital Video Disk (DVD) players, High Definition Digital Television (HDTV) equipment, and numerous other products. In CCD-based circuits, signals are represented as charge packets or as differential charge packet-pairs.

The CCD devices themselves provide a basic function of storing and moving isolated packets of charge. Various circuits are known in the art for then performing arithmetic and other operations on the stored packets. For example, charge packets can be added together (merged), split into two or more pieces, conditionally steered down one circuit path or another, destructively or non-destructively sensed, and the like. The availability of these circuits make it quite easy to adapt CCDs to a large number of signal processing tasks.

One mathematical operation which has proved somewhat difficult to implement is subtraction. Various methods for this have been described in previous publications and/or patents. For example, U.S. Pat. No. 4,239,983 issued to Edwards, N. P. et al., and assigned to International Business Machines Corporation, discloses a circuit for obtaining a quantity of electrical charge that is representative of the difference between two original charge quantities. In the approach described in this patent, a pair of CCD input shift registers each contain at least one potential well that is operated in a floating gate mode. The two spatially separated charge packets are sequenced into and out of the pair of registers. The two floating gate electrode outputs are then combined at a common node and rectified. The rectified output represents the difference between the two original charge packets.

Publications by Fossum, E. R., "A linear and compact charge coupled charge packet differencer/replicator", *IEEE Trans. Electron Devices*, Vol. 31, No. 12, pp 1284–1287, December 1984; and "Wire transfer of charge packets using a CCD-BVD structure for a charge domain signal processing," *IEEE Trans. Electron Devices*, Vol. 38, No. 2, pp. 291–298, February 1991, describe still other approaches to charge subtraction by removing a fixed amount of charge from a charge packet. However, these circuits suffer from various problems such as introducing non-linearities, susceptibility to noise, and slow operating speed.

The prior art also includes another method for subtracting a charge, using a voltage stored in a capacitor. This method does not provide for directly subtracting two signal charge packets—but it does allow a signal (or a constant value introduced as a voltage) to determine the amount of charge to be subtracted. In this circuit, a so-called "wire transfer" device is used that is similar to the one described in the above mentioned papers by Fossum. In this improved approach, however, a capacitor and switched voltage node are used together with the wire transfer device to perform charge subtraction.

This technique does have advantages over other methods of charge subtraction since it (1) is very linear with respect to the subtracted or added values; (2) can be made very linear with respect to the starting charge packet value from which the subtraction occurs; (3) operates at the same speed as the CCD signal processing elements in which it is embedded; (4) introduces very little noise; and (5) can be used to transfer charge from one CCD segment to a non-adjacent CCD segment during the subtraction/addition process.

SUMMARY OF THE INVENTION

Charge subtraction circuits that use a wire transfer device and voltage-switched capacitor are therefore known in the art. However, when the amount of charge to be subtracted makes up a large fraction (such as greater than 80% or 90% or more) of the input charge, a "memory effect" is observed in these circuits. In other words, the value of the previous input may have a pronounced effect on the actual amount of charge subtracted for a subsequent sample. This is a highly undesirable result in a circuit which is expected to subtract a very precise amount of charge on successive clock cycles at high operating frequency.

The present invention is an extension of the known techniques for subtracting or adding charge using a wire transfer, switched capacitor type device. In a preferred embodiment of the invention, the charge processing circuit is pipelined, to permit subtraction or addition of the desired charge amount in several successive stages.

For example, in the case of a subtraction implementation, multiple charge subtraction stages are provided. Each stage subtracts a relatively small fraction of the overall total amount of charge to be removed, at least small enough to prevent the introduction of the memory effect. The result of each subtraction stage is preferably buffered, such as by a CCD holding register, until it is ready to be transferred into the next subtraction stage. The combined effect of the sequence of subtraction stages is to remove the total desired amount of charge. As a result, no one stage introduces a memory effect and yet, overall, the desired amount of charge is subtracted, even when that amount of charge is 80%, 90% or even a higher fraction of the input charge.

In one preferred embodiment, the subtraction is pipelined using at least two stages. However, extension to more that two stages is straightforward and is typically utilized in designs requiring high frequency operation, or if subtraction of relatively large fractions of the input charge (e.g., >90% of the input amount) are required.

In certain embodiments, the charge subtraction amounts are selected to be progressively smaller for successive stages of the pipeline.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 is a schematic drawing of a charge subtraction circuit implementation of the present invention.

FIGS. 3A–3C are a first series of charge potential diagrams illustrating the operation of the wire transfer subtraction stage.

DETAILED DESCRIPTION OF A PREFERRED EMBODIMENT

The present invention is a circuit that is capable of being configured to subtract a precise amount of charge from a given charge sample in a Charge Coupled Device (CCD). A key feature of the invention is the ability to subtract an amount of charge from any value of input charge sampled at high operating frequencies, even when the amount of charge to be subtracted makes up a very large fraction (greater than 90%) of the input charge sample. Unlike prior art approaches to charge subtraction, the present invention does not suffer from a memory effect on the value of charges subtracted. The subtraction operation is split into two or more stages, with each stage removing only a portion of total charge to be removed. The subtraction stages together combine to remove the total desired value of charge. In a preferred embodiment, each successive subtraction stage removes a correspondingly lesser amount of charge. The invention not only provides for greater accuracy in the amount of charge removed, but can operate at higher frequencies than previous known charge subtraction circuits.

Figure 1:
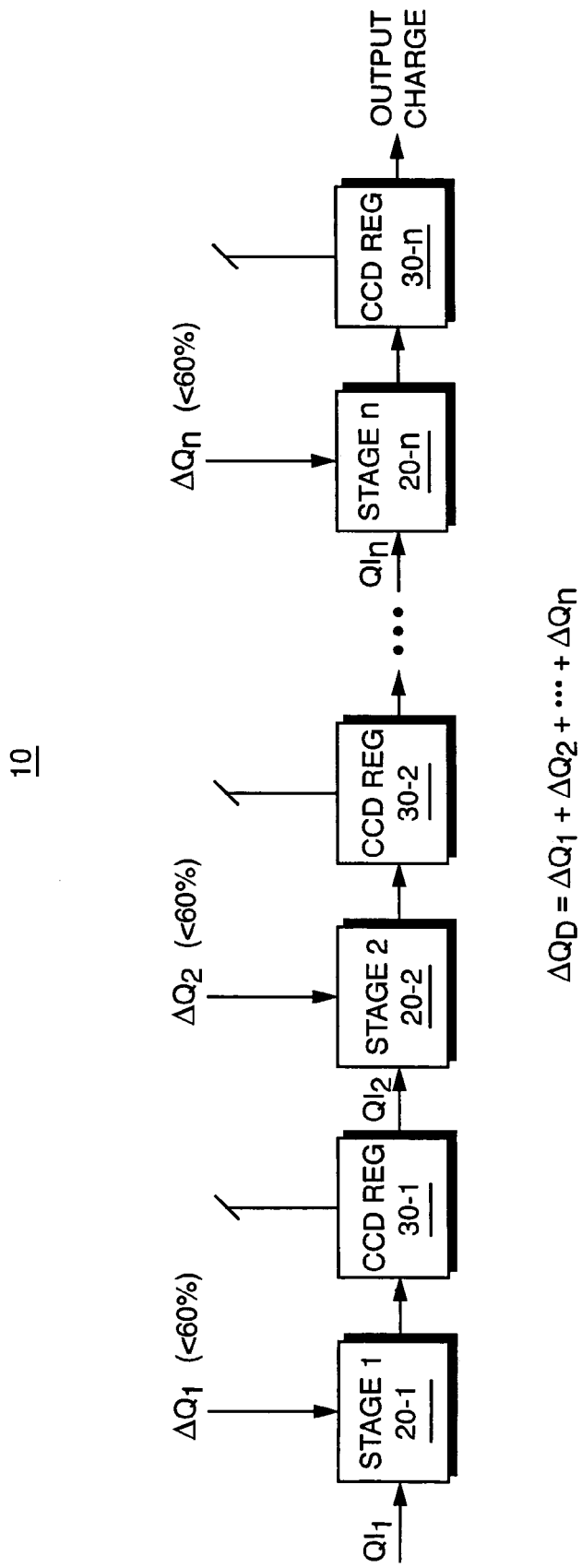
FIG. 1 is a detailed diagram of a wire transfer subtraction stage.

Now with reference to FIG. 1, when the invention is implemented as a charge subtraction function 10, it consists of two or more charge subtraction stages 20-1, 20-2, . . . 20-n. An exemplary first charge subtraction stage 20-1 accepts an input charge from the left hand side and a voltage indicating an amount of charge to be removed, $\Delta Q1$. After removing the desired amount of charge, an output CCD holding register 30-1 stores the results of the subtraction of the respective stage 20-1.

Subsequent subtraction stages, such as stage 20-2, operate similarly to first subtraction stage 20-1. However stage 20-2 removes a different charge amount, $\Delta Q2$, and CCD holding register 30-2 is used to store the result of second subtraction stage 20-2.

Ultimately, the $n^{th}$ subtraction stage 20-n removes its associated amount of charge $\Delta Qn$ producing a final result at output holding register 30-n.

Note that the total amount of charge removed, $\Delta Qd$, is equal to $$\Delta Qd = \Delta Q1 + \Delta Q2 + \ldots + \Delta Qn$$

The successive subtraction stages 20-2, . . . 20-n, in a preferred embodiment, remove a smaller amount of charge than their immediate predecessor stages. For example, in an implementation that is to remove 93.6 fC (fempto-coulombs) from a 100 fC input charge, or 93.6%, these stages could be arranged with:

$$\Delta Q1 = 60 \text{ fC} = 60\% \; QI1$$
$$\Delta Q2 = 24 \text{ fC} = 60\% \; QI2$$
$$\Delta Q3 = 9.6 \text{ fC} = 60\% \; QI3$$

so that $$\Delta Qd = 60 \text{ fC} + 24 \text{ fC} + 9.6 \text{ fC} = 93.6 \text{ fC} = 93.6\% \; QI1$$

The net result is removal of approximately 93.6% of the input charge. This result is obtained without the need for any one of the individual substraction stages 20-1, 20-2, . . . 20-n to be responsible for removing more than about 60% of the total input charge. By so limiting the charge sample removal amount that any particular subtraction stage 20 must handle, any severe memory affect on the ability to correctly remove is avoided. In other words, many inaccuracies in the amount of charge subtracted for subsequent samples will no longer occur.

We now discuss operation of one of the subtraction stages using a wire transfer device and storage capacitor. It should be understood that other charge subtraction circuits may also be used.

FIG. 2 is a more detailed view of one of the subtraction stages 20-1 and registers 30-1.

FIGS. 3A–3G illustrate channel potential (surface potential) levels under the various electrodes of the stage 20-1 at successive times.

Figure 3B:
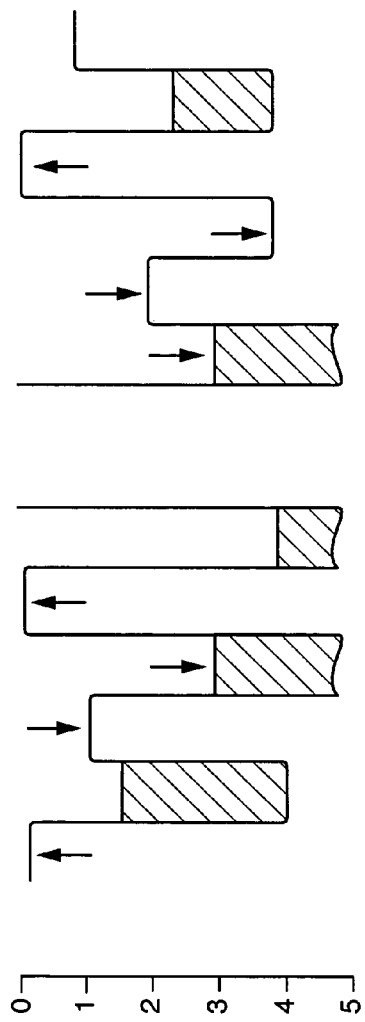
Figure 3C:
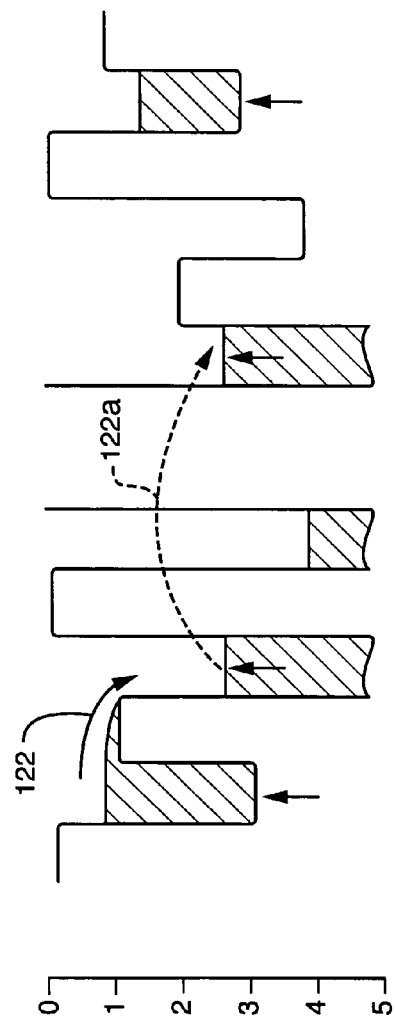
Figure 3D:
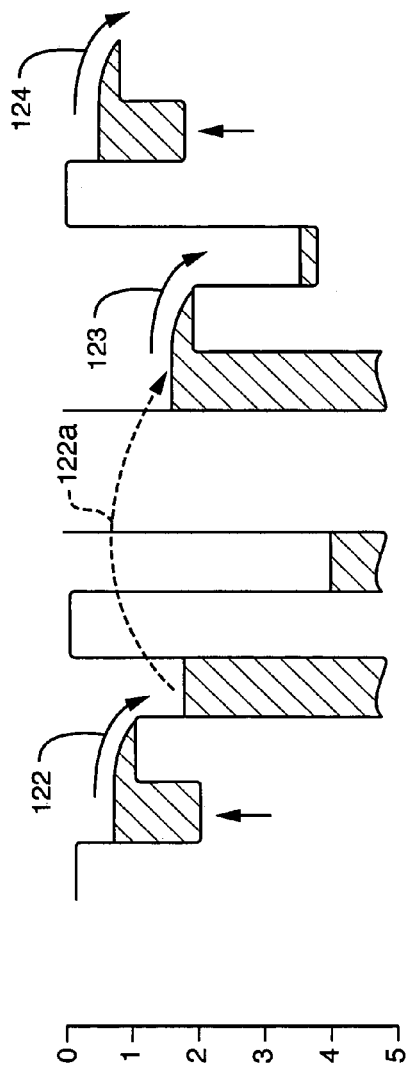
FIGS. 3D–3G are further diagrams illustrating the operation of the subtraction stage.
Figure 3E:
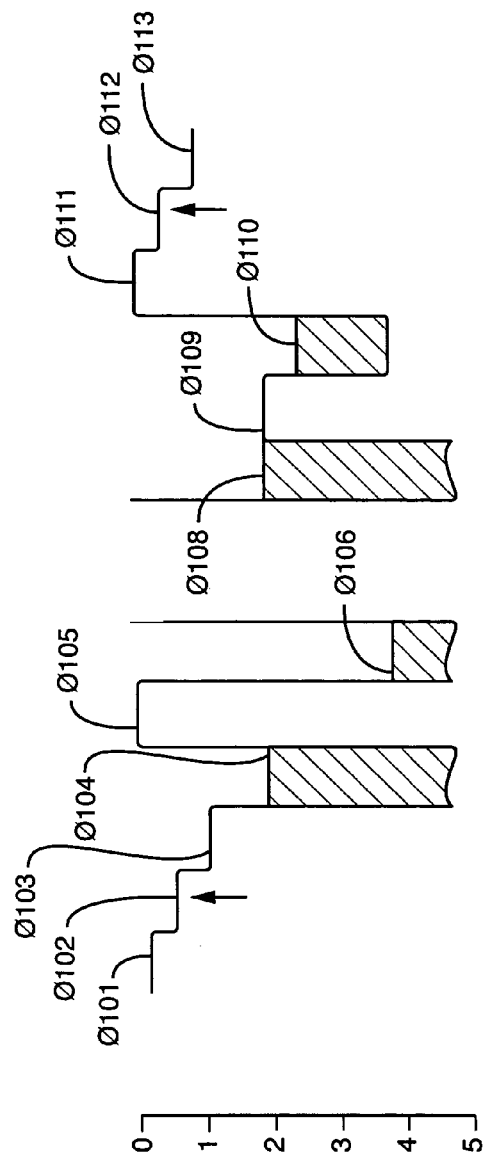
Figure 3F:
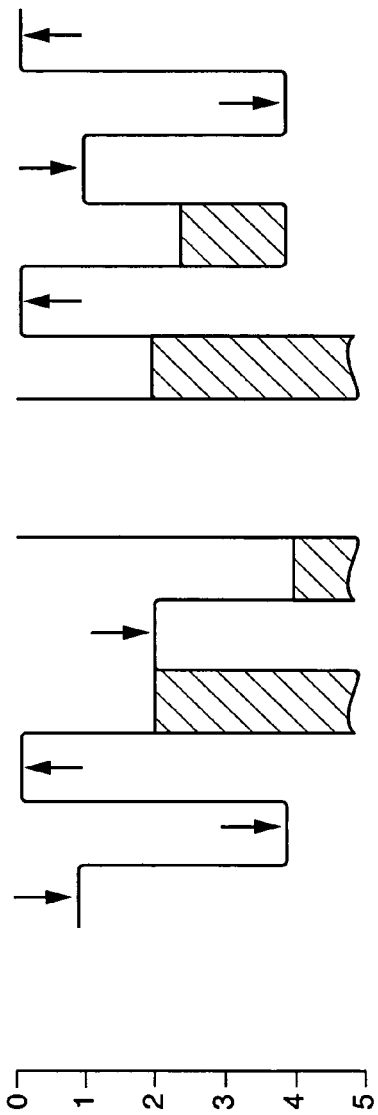
Figure 3G:
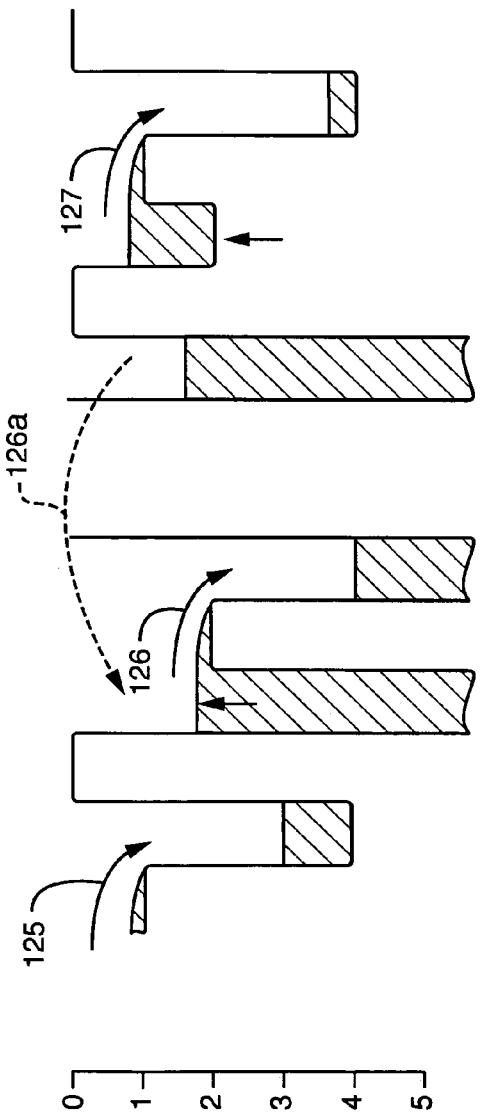
Figure 4:
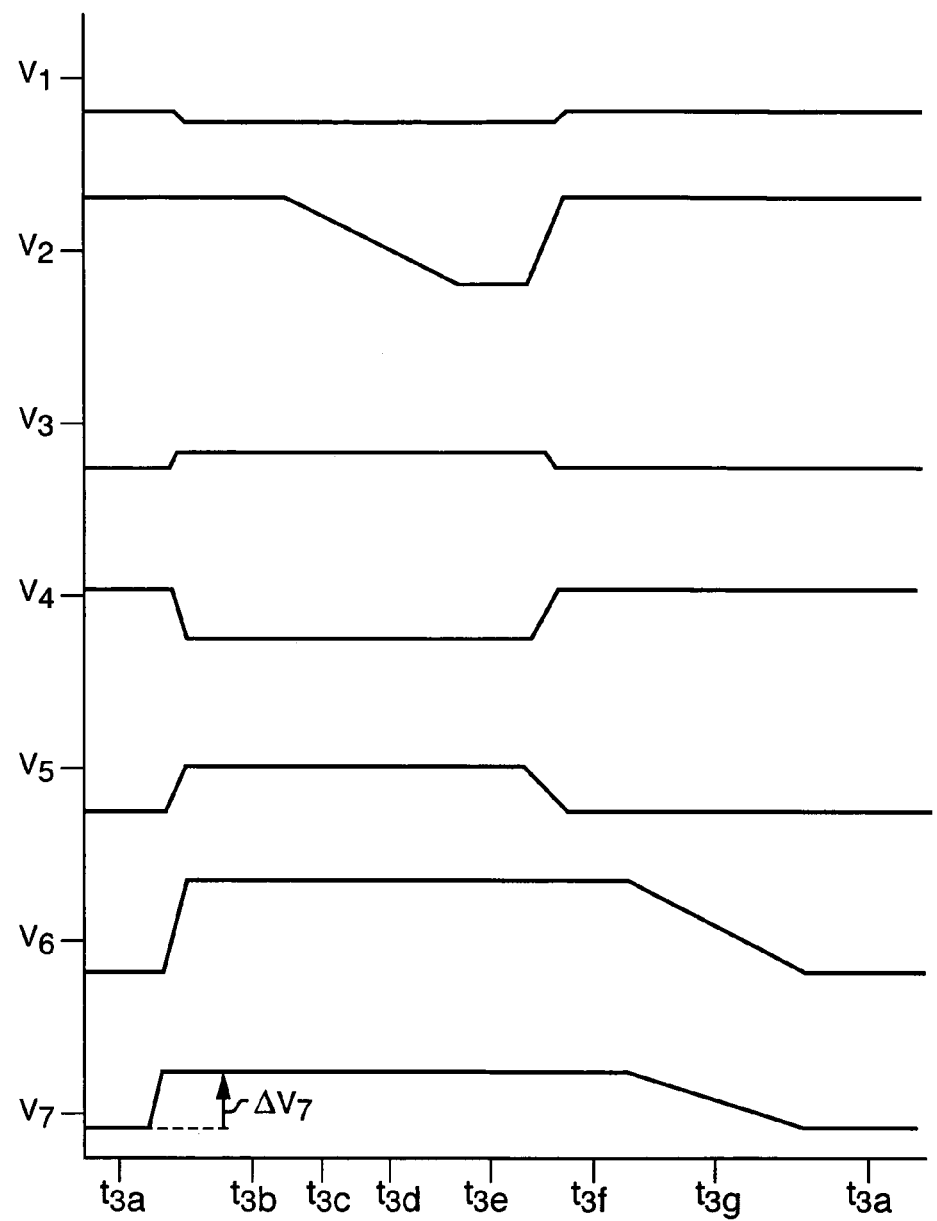
FIG. 4 is a timing diagram showing the voltages applied to various nodes of the subtraction stage of FIG. 2.

FIG. 4 shows the gate voltage waveforms implied by the foregoing discussion. The instances represented by FIGS. 3A–3G are indicated on FIG. 2 for reference and identified as $T_{3A}$–$T_{3G}$.

Note that the representation of the device elements in FIG. 2 and the representation of the charges and potentials in FIG. 3 are in a form familiar to those are skilled in the art accustomed to designing with CCDs. Note also that, although the figures and accompanying explanation below assumes a surface channel, overlapping gate, N-channel CCD process, the invention is equally applicable to other types of CCDs. Such other types may include buried channel CCDs, CCDs with other gate designs, P-channel CCDs, Schottky-barrier CCDs, and the like. More complex designs, such as cascode designs may also be used with the invention. In addition, clocking schemes other than the one shown can be used to implement the subtraction stages.

Beginning at the left side of the diagrams, FIG. 2 shows three successive CCD gates, 101, 102 and 103, driven, respectively, by clock voltages V1, V2 and V3. It is assumed that these gates constitute the continuation of a CCD shift register which provides an input charge sample towards the left of FIG. 2. Within the clocking scheme used for a subtraction stage 20, even numbered gates are so called storage gates and odd numbered gates are so called barrier gates.

Following gate 103 is a diffusion region 104, a gate 105 driven by another clock voltage V4, and a second diffusion region 106. Diffusion region 106 is held at a constant voltage V8.

The right hand sides of the drawings show a second portion of the subtraction stage 20 and the associated potential levels which may be located in a separate region of the common substrate with the components on the left hand side.

This second portion of the subtraction stage 20 includes a third diffusion region 108 followed by CCD gates 109, 110, 111, 112 and 113.

The holding register 30 consists of gates 109 and 110 and is driven, respectively, by clock voltages V5 and V6. Gates 111, 112, and 113 are driven by clocks V1, V2 and V3.

The second or right hand side part of the device is connected to the first (left) part thereof by a connection 107, which is referred to herein as a "wire", which is made of metal or other conductor. The wire joins the two diffusions 104 and 108.

Also connected to wire 107 and node A is a capacitor 114, driven by a switched voltage V7. Node 107 is left floating; its potential is achieved as described below. Note that because of wire 107 and Node A, the potentials of diffusions 104 and 108 are always equal. Therefore any tendency towards imbalance between diffusions 104 and 108 is corrected by current flow through the wire 107.

The following discussion refers to the "surface potentials" underneath the various gates and diffusion regions. These potentials are identified in FIG. 3A; they are equally applicable (although not labeled) in FIGS. 3B–3G for the sake of clarity. The discussion below also assumes electrons as signal charges, so that a positive change in gate voltage results in a negative change in surface potential. The surface potential of diffusions 104, 106, and 108 are taken to be the negative of the voltage at their external connections. Thus, the potential diagrams are inverted in the sense that the more negative the surface potential, the greater the charge storage capability. In general, charge packet flow in the device occurs from left to right in the figures.

Please note that it is also helpful to refer to the voltage diagrams of FIG. 4 in connection with the following discussion. The times in FIG. 4 correspond to the states represented by each FIGS. 3A–3G. For example, $T_{3A}$ in FIG. 4 corresponds to the state of voltages V1–V7 to produce the charge state diagram of FIG. 3A, $T_{3B}$ is the set of voltages that correspond to the state of charges in FIG. 3B, and so on.

An initial state of the device is depicted in FIG. 3A. Charge packets are held under gates 102 and 112. The charge packet under gate 102 is used as an input charge to the subtraction stage 20, and the charge packet under gate 112 is an output charge that becomes the charge held by a corresponding holding register 30 described in connection with FIG. 1.

The potential of diffusions 104 and 108 has been set by allowing charge from these diffusions (through the wire connection 107) to flow over barrier gate 105 into diffusion 106, which acts as a drain. This flow is identified as current 121 indicated by the arrow. At the end of this process as depicted in FIG. 3A, current 121 has declined to a negligible value, and the potential of diffusions 104 and 108 has settled to the surface potential under gate 105, set by voltage V4.

FIG. 3B shows the potentials resulting from the first change in gate voltages V1, V3, V4, V5, V6, and a subtraction control voltage V7. The changes are indicated by up and down arrows. V5 takes on the value that V4 had in FIG. 3A so that surface potential Ø109 in FIG. 3B now equals potential Ø105 in FIG. 3A (that is, approximately −2 volts). No signal currents flow during the transition from FIG. 30 to FIG. 3B. Note that ΔV7, the positive change in V7, results in a negative change in the surface potential of diffusions 104 and 108.

FIG. 3C shows the start of the next phase of operation, in which V2 ramps negative (driving surface potentials Ø102 and Ø112 positive). The result, as shown in FIG. 3C, is that current 122 flows over the barrier at gate 103 and begins to raise the surface potential of diffusion 104. Conduction through wire 107 carries a portion of this current, 122A, onward toward diffusion 108, thus maintaining the two diffusions 106, 108 at the same potential. As depicted in FIG. 3C, the potential of the diffusions has not yet reached the value that it had back in the state of FIG. 3A, so no current yet flows over the barrier at gate 109.

During the next state, shown in FIG. 3D, V2 continues to ramp negative (see for example FIG. 4). The potential of diffusions 104 and 108 has risen high enough for charge to flow over the barrier at gate 109, resulting in current 123.

Also, the potential under gate 112 has now risen enough for current 124 to begin flowing over the barrier at gate 113. Current 124 transports the signal charge from gate 112 into the continuing portion of the CCD signal processing circuit which in the case of the invention will be one of the CCD holding registers 30 associated with the particulars of subtraction stage 20.

FIG. 3E shows the completion of the phase which began with FIG. 3D. All of the charge which was under the storage gate 112 has now moved beyond the viewpoint shown. The charge which was under the storage gate 102 has flowed into diffusion regions 104 and 108. Some of it has continued on over the barrier at gate 109 to storage gate 110, carried as current 123 in FIG. 3D. Current 123 has also declined to a negligible value, as current 121 had in FIG. 3A. Given that V 109 in this figure is equal to V 105 in FIG. 1A, the potential of diffusions 104 and 108 and thus the voltage of node 107 has returned to what it was in FIG. 3A. For this to be true, capacitor 114 must have been charged by an amount $$\Delta Q = C \cdot \Delta V7$$

The charge packet resulting under gate 110 is thus reduced from the original packet under gate 102 by this amount, ΔQ. Where C is the capacitance of capacitor 114.

FIG. 3F shows the result of changing clock voltages V1, V2, V3, V4 and V5 as indicated. These voltages have now returned to the values they had in the state of FIG. 3A. No signal charge transfer thus occurs during this transition.

FIG. 3G shows the next charge transfer phase, where V6 and V7 are ramped negative, resulting in positive ramps in surface potentials V110, V104, and V108 (and a negative ramp in V107). Currents 125 (introducing a new input charge) and 127 (conveying the output charge) flow in the usual manner of CCD transfers. Current 126 carries charge from diffusion 104 over the barrier at gate 105 to drain 106. Current 126A flows from diffusions 108 to diffusion 104 via wire 107, maintaining the diffusions that equal potentials. Currents 126 and 126A thus constitute the disposal of charge ΔQ which was subtracted from the earlier signal charge packet. At the completion of this phase, the device has now returned to the initial state depicted in FIG. 3A, with the charge originally under gate 102 now under gate 112, and having been reduced by ΔQ.

The charge subtracted in each full cycle of the subtraction stage 20 is $$\Delta Q = C \Delta V7$$

where ΔV7 is the change in voltage V7 between the states of FIG. 3A and FIG. 3B. If this voltage change ΔV7 is constant, then the subtracted charge ΔQ is also constant for successive packets as well. The result is thus removal of a fixed amount of charge from all packets in a charge sequence. This case is of interest, for example, in connection with removal of a portion of a background charge when the signal charges of interest are only a fraction of the total packet size. For signals represented as differential charge packets (see below) this constant subtraction can remove part of the common mode charge.

The amount of such charge to be removed (proportional to ΔV7) can be determined in various ways and depends upon the application for the circuit 10. This can include adjustment by feedback or feed forward reference to the charge packet.

In other applications, the charge to be subtracted may be a time varying quantity representing a second signal. Such a signal can be applied to either the high or low level, or both, of V7 as long as ΔV7 is appropriately controlled.

The potential diagrams in the waveforms shown herein can also be adapted for the case of adding charges. While not shown in detail in the drawings, basically when adding rather than subtracting charge, the sign of the voltage V7 is reversed and the discharge operation of node 107 in FIGS. 3F, 3G and 3H becomes a recharge operation.

The description above assumes a single stream of signal charge packets. However in many applications paired charge packets are used such that the signal is represented as a charge difference between members of a pair of charge packets. This method allows, for example, the representation of signed (plus and minus) signal values. If the charge packet pair is carried sequentially in a single CCD register, then the method disclosed herein is directly applicable by repeating ΔV7, so that the same ΔQ is removed from (or added to) each member of the pair.

If the charge packet pair is carried in parallel pair of CCD registers, then the method disclosed herein can also be used. In this instance, the device structure shown in FIG. 2 is duplicated with one copy for each of the two CCD registers of the differential pair. V7 is applied to the two registers via two capacitors equivalent to capacitor 114. If the capacitors are equal, then the subtracted or added charges ΔQ will also be equal.

While this invention has been particularly shown and described with references to preferred embodiments thereof, it will be understood by those skilled in the art that various changes in form and details may be made therein without departing from the scope of the invention encompassed by the appended claims.

What is claimed is:

1. A charge processing device comprising:
    a plurality of processing stages each stage comprising
        a charge processing circuit, for accepting an input charge packet, and a signal representative of an amount of charge difference, and applying the charge difference to the input charge packet; and
        a holding register to hold the result of the charge processing circuit, and to feed the result to a next charge processing circuit such that the plurality of charge processing circuits are arranged in a series pipeline; and
    such that no one stage in the plurality of stages introduces a memory effect in any of the charge processing stages due to processing an amount of charge difference applied to the input charge greater than a predetermined amount.

2. A device as in claim 1 wherein the number of processing stages is greater than two.

3. A device as in claim 1 wherein the overall amount of charge processed by the plurality of processing stages is greater than 80% of the input charge amount fed to the first stage.

4. A device as in claim 1 wherein the charge processing circuit uses a wire transfer switched capacitor circuit arrangement for charge processing.

5. A device as in claim 1 wherein the charge difference amount represents a negative amount, such that the charge processing device is a charge subtractor.

6. A device as in claim 1 wherein the charge difference amount is a positive amount such that the charge processing device is a charge adder.

7. A device as in claim 1 wherein the charge difference amount applied to successive stages in the pipeline is smaller than an the charge difference amount processed by an immediately preceding stage.

8. A device as in claim 1 wherein the amount of charge removed from successive charge packets is equal, resulting in processing a constant amount of charge for a plurality of packets in a charge packet sequence.

9. A device as in claim 1 wherein the charge difference amount represents a time varying quantity such that successive charge packets are processed with different charge amounts.

10. A device as in claim 5 wherein the processing stage uses a discharge node to discharge a capacitor to provide charge subtraction.

11. A device as in claim 6 wherein the processing stage uses a recharge operation with a capacitor to provide charge addition.

12. A device as in claim 1 wherein a pair of parallel charge processing pipelines process a charge packet pair, the charge packet pair representing a charge of members of a pair of charge packets.

13. A device as in claim 1 wherein successive signal charges represent paired charge packets with the first charge packet of the pair followed by a second charge packet in sequence and a charge difference amount is applied in repetition to the charge pairs.

* * * * *